(12) United States Patent
Tagawa

(10) Patent No.: US 7,135,393 B2
(45) Date of Patent: Nov. 14, 2006

(54) SEMICONDUCTOR DEVICE MANUFACTURE METHOD CAPABLE OF SUPRESSING GATE IMPURITY PENETRATION INTO CHANNEL

(75) Inventor: Yukio Tagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/118,370

(22) Filed: May 2, 2005

(65) Prior Publication Data

US 2005/0191831 A1 Sep. 1, 2005

Related U.S. Application Data

(63) Continuation of application No. PCT/JP03/05560, filed on Apr. 30, 2003.

(51) Int. Cl.
*H01L 21/265* (2006.01)
*H01L 21/425* (2006.01)
*H01L 21/3205* (2006.01)
*H01L 21/336* (2006.01)

(52) U.S. Cl. .............. 438/519; 438/527; 438/530; 438/257; 438/595

(58) Field of Classification Search .............. 438/519, 438/527, 549, 530, 257, 197, 595
See application file for complete search history.

(56) References Cited

U.S. PATENT DOCUMENTS

| | | | | |
|---|---|---|---|---|
| 5,976,923 | A * | 11/1999 | Tung ........................... | 438/228 |
| 6,569,742 | B1 * | 5/2003 | Taniguchi et al. ........... | 438/303 |
| 6,894,353 | B1 * | 5/2005 | Samavedam et al. ........ | 257/365 |
| 6,908,837 | B1 * | 6/2005 | Taniguchi et al. ........... | 438/583 |
| 7,041,549 | B1 * | 5/2006 | Ootsuka ........................ | 438/231 |
| 2005/0230781 | A1 * | 10/2005 | Ema et al. .................... | 257/510 |
| 2006/0113627 | A1 * | 6/2006 | Chen et al. .................. | 257/500 |

FOREIGN PATENT DOCUMENTS

| | | |
|---|---|---|
| JP | 62-120082 | 6/1987 |
| JP | 4-283966 | 10/1992 |
| JP | 9-23003 | 1/1997 |
| JP | 9-260649 | 10/1997 |
| JP | 10-22503 | 1/1998 |
| JP | 11-186188 | 7/1999 |

OTHER PUBLICATIONS

Atsushi Hori et al., High Speed 0.1 μm Dual Gate CMOS with Low Energy Phosphorus/boron Implantation and Cobalt Salicide, pp. 575-578, IEDM 1996.

* cited by examiner

*Primary Examiner*—Chuong Anh Luu
(74) *Attorney, Agent, or Firm*—Westerman, Hattori, Daniels & Adrian, LLP.

(57) ABSTRACT

A gate electrode is formed above an n-type well including an n-type threshold voltage adjustment region, ions of p-type impurity are implanted with a low acceleration energy to form extension regions in the n-type well on both sides of the gate electrode, side wall spacers are formed on the side walls of the gate electrode, ions of p-type impurity are implanted with a small dose causing substantially no abnormal tailing in the gate electrode and with a relatively high acceleration energy to form p-type source/drain regions deeper than the threshold adjustment region, ions of atoms are implanted into the semiconductor substrate to change the upper parts of the gate electrode and the source/drain regions to amorphous state, ions of p-type impurity are implanted with a large dose to form high-concentration parts in the source/drain regions, and the impurities introduced by the ion implantation are activated.

17 Claims, 8 Drawing Sheets

SEMICONDUCTOR DEVICE MANUFACTURE METHOD CAPABLE OF SUPRESSING GATE IMPURITY PENETRATION INTO CHANNEL

CROSS REFERENCE TO RELATED APPLICATION

This application is a continuation application of an International Patent Application PCT/JP2003/005560 filed on Apr. 30, 2003, the entire contents of which are incorporated herein by reference.

BACKGROUND OF THE INVENTION (A) Field of the Invention

The present invention relates to a semiconductor device manufacture method, and more particularly to a method of manufacturing a semiconductor device having very fine transistors.

(B) Related Art

Semiconductor integrated circuit devices are at the stage of higher integration degree and operation speed. Constituent elements of a semiconductor integrated circuit device, MOS transistors, are becoming very fine in accordance with the scaling rules. The gate insulating film becomes thin and the gate length becomes short. The height of the gate electrode is limited.

As the gate length becomes short, carriers can punch through from the source to drain and the short channel effect appears. In order to prevent the short channel effect, extension regions having shallow junctions are formed in intermediate areas between the source/drain regions.

If element isolation is formed by local oxidation of silicon (LOCOS), bird's beaks are formed gradually thickening the oxide film so that an area of an active region and hence an integration degree are limited. In place of LOCOS, shallow trench isolation (STI) has been adopted by which a trench is formed in a substrate and an insulating film is buried in the trench. With STI, the roughness of a substrate surface can be reduced.

As the gate insulating film is thinned, a phenomenon appears which cannot be neglected: impurities in the gate electrode penetrate through the gate insulating film and invade the channel region. As impurities enter the channel region, a threshold voltage of the channel region varies. Among other ions, boron (B) ions implanted into the gate electrode of a p-channel transistor are likely to penetrate through the gate electrode. Impurity penetration is influenced by ion implantation into the gate electrode and the conditions of subsequent heat treatments. Impurity penetration can be mitigated by executing impurity ion implantation into the gate electrode at a low acceleration energy and executing activation annealing in a very short time.

In general, Ion implantation into the gate electrode and ion implantation into the source/drain regions are carried out simulataneously. At a low acceleration energy, the source/drain regions become shallow. Well forming ion implantation and threshold voltage adjusting ion implantation are performed for an active region. If the source/drain junctions are shallow, these junctions are positioned in the region having an impurity concentration raised by the threshold voltage adjusting ion implantation, so that a junction capacitance increases. An increase in capacitance lowers the operation speed. Further, a shallow junction increases leak current.

FIG. 4A shows an example of the structure of an n-channel MOS transistor. If the conductivity type is reversed, the structure is of a p-channel MOS transistor. An element isolation trench is formed in a surface layer of a silicon substrate 101, and an insulator is buried in the trench to form an element isolation region 102. In an active region defined by the element isolation region 102, p-type impurities are implanted to form a p-type well 103. In a p-type well surface layer, p-type impurity ions are implanted to form a channel region 104 having a higher impurity concentration and adjusted threshold voltage.

The surface of the silicon substrate is thermally oxidized to form a gate insulating film 105, and a poly-silicon layer 106 is deposited on the gate insulating film. The poly-silicon layer and underlying gate insulating film are patterned to form a gate electrode. By using the gate electrode as a mask, n-type impurity ions are implanted to form n-type extension regions 107. A silicon oxide layer is deposited covering the gate electrode. The silicon oxide layer is etched back to form side wall spacers 108 on the gate electrode side walls.

Impurity ions of the n-type are again implanted to form deep source/drain regions 109 and also implanted into the gate electrode at a sufficient impurity concentration. A metal layer of Co or Ni is deposited on the substrate surface by sputtering and form silicide layers 110 on the surfaces of the source/drain regions and on the surface of the gate electrode.

An insulating layer 112 of silicon oxide or the like is deposited covering the gate electrode, and contact holes are formed through the insulating layer. Conductive plugs 114 are embedded in the contact holes.

In the STI forming process, a silicon nitride layer having an underlying silicon oxide layer is used as a stopper layer for chemical mechanical polishing (CMP). In a process of removing the silicon nitride layer and silicon oxide layer, the shoulder 120 of STI is etched slightly. A concave portion 122 is therefore formed at the STI edge in contact with the active region. An existence of this concave portion swells the silicide layer 110 downward, and also the conductive plug 114 may extend lower than the active region surface. If the effective thickness of the source/drain regions becomes thin, leak current is likely to flow through the source/drain junctions.

FIG. 4B shows another structure formed at a lower ion implantation acceleration energy in order to prevent impurities from penetration through the gate insulating film. Ion implantation into the gate electrode is the same as that into the source/drain regions, so that the junction depth of the source/drain regions 109 becomes shallow. Since the threshold voltage adjusting region 104 is formed in the surface layer of the silicon substrate, the impurity concentration is increased.

A pn junction between the source/drain regions 109 and the threshold volatge adjusting region 104 has a large junction capacitance. Since the source/drain region junction is shallow, a distance between the silicide region 110 and the pn junction becomes short and leak current is likely to flow, assuming a constant depth of the silicide region 110. As described above, the shallow source/drain regions result in an increase in capacitance and leak current and a serious obstacle against a circuit operation.

If the silicide region 110 protrudes downward by the influence of the concave portion on the STI region surface and the conductive plug 114 extends lower than the active region surface, the distance between these conductive regions and the pn junction becomes short. This is the main cause of leak current, among others.

A phenomenon called channeling in silicon crystal is known. As Ion implantation is performed into silicon crystal along a particular direction, atoms are implanted deeper than other methods. This phenomenon is due to the structure established in crystal, called "channel", through which atoms are easy to move.

If silicon crystal is made amorphous, a channel specific to the crystal disappears and the channeling is hindered. There are various proposals for limiting an arrival depth of implanted ionic atoms by making silicon crystal amorphous before ion implantation is performed. For example, it is known that silicon crystal can be made amorphous by implanting ionic Ge which is the same group element as Si. Since Ge is the same group element as that of Si, the electric characteristics are not influenced fundamentally.

Japanese Patent Laid-open Publication No. HEI-9-23003 discloses the following method. After ion implantation for extension regions, side wall spacers are formed. For an n-channel transistor, phosphorus ions are implanted at an acceleration energy of 20 keV to 60 keV and a dose of about $1\times10^{13}$ cm$^{-3}$ to $3\times10^{14}$ cm$^{-3}$, and for a p-channel transistor, silicon ions are implanted to make silicon preliminarily amorphous for channeling prevention, and thereafter boron ions are implanted at an acceleration energy of 10 keV to 30 keV and a dose of about $1\times10^{13}$ cm$^{-3}$ to $3\times10^{14}$ cm$^{-3}$, to thus form deep source/drain regions.

After the deep source/drain regions are formed, silicidation is performed. Thereafter, ion implantation is further executed to increase the impurity concentration of a region under the silicide layer and lower parasitic resistance.

Japanese Patent Laid-open Publication No. HEI-10-22503 proposes a suppression of an arrival depth of phosphorus (P) ions. In forming source/drain regions of an n-channel transistor, first As ions are implanted to make silicon crystal preliminarily amorphous and the P ions are implanted to prevent the channeling in the amorphous layer.

SUMMARY OF THE INVENTION

It is an object of the present invention to provide a semiconductor device manufacture method capable of suppressing impurity ions implanted into a gate electrode from penetration through a gate insulating film and suppressing an increase in capacitance of source/drain regions and an increase in leak current.

It is another object of the present invention to provide a semiconductor device manufacture method capable of suppressing impurity ions implanted into a gate electrode having a limited height from penetration through a gate insulating film and forming source drain region junctions deeper.

It is still another object of the present invention to provide a semiconductor device manufacture method capable of suppressing a threshold voltage variation, and reducing parasitic capacitance of source/drain regions and leak current.

According to one aspect of the present invention, there is provided a semiconductor device manufacture method comprising steps of: (a) preparing a semiconductor substrate comprising a well of a first conductivity type having a first depth and a threshold voltage adjusting region formed in the well having a second depth shallower than the first depth; (b) forming a gate electrode over the semiconductor substrate, with a gate insulating film being interposed therebetween; (c) forming shallow low resistance regions in the semiconductor substrate by implanting impurity ions of a second conductivity type at a first dose and a first acceleration energy, to form extension regions in the semiconductor substrate on both sides of the gate electrode; (d) forming side wall spacers on side walls of the gate electrode; (e) forming source/drain regions by implanting impurity ions of the second conductivity type at a second acceleration energy higher than the first acceleration energy and a second dose, the source/drain regions forming junctions at a third depth deeper than the second depth; (f) implanting ions into the semiconductor substrate to make amorphous an upper layer of the gate electrode and upper layers of the source/drain regions; (g) implanting impurity ions of the second conductivity type at a third acceleration energy and a third dose larger than the second dose to form high concentration regions in the source/drain regions; and (h) activating implanted impurity ions.

According to another aspect of the present invention there is provided the semiconductor manufacture method according to claim 1, further comprising steps of: (a1) preparing the semiconductor substrate further comprising another well of the second conductivity type having a fourth depth and a threshold voltage adjusting region formed in the another well and having a fifth depth shallower than the fourth depth, the step (b) forming another gate electrode over the semiconductor substrate, with a gate insulating film being interposed therebetween; (c1) forming shallow low resistance regions in the another well by implanting impurity ions of the first conductivity type at a fourth dose and a fourth acceleration energy not allowing to penetrate through the gate insulating film under the other gate electrode, to form extension regions in the another well on both sides of the other gate electrode; (e1) forming other source/drain regions in the another well by implanting impurity ions of the first conductivity type at a fifth acceleration energy higher than the fourth acceleration energy, the source/drain regions forming junctions at a sixth depth deeper than the fifth depth; and (g1) implanting impurity ions of the first conductivity type at a sixth acceleration energy and a sixth dose larger than the fifth dose to form high concentration regions in the other source/drain regions, wherein the step (d) forms side wall spacers also on side walls of the other gate electrode, the step (f) implants ions to make amorphous an upper layer of the other gate electrode and upper layers of the other source/drain regions, and the step (h) activates implanted impurity ions in the another well.

DESCRIPTION OF THE PREFERRED EMBODIMENTS

Prior to the description of embodiments of the present invention, the characteristics of ion implantation will be described as background art.

Figure 5A:
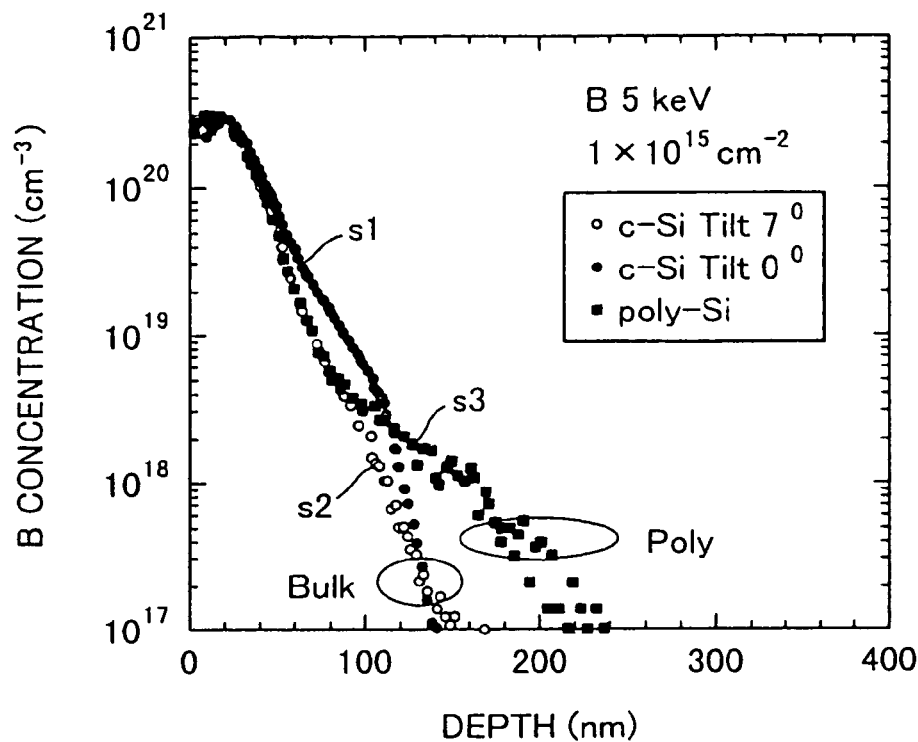
FIGS. 5A and 5B are graphs explaining the characteristics of ion implantation into single crystal silicon and polysilicon.

FIG. 5A is a graph showing the characteristics of ion implantation into single crystal silicon and poly-silicon. Different behaviors can be seen if ions are implanted into single crystal silicon and poly-silicon at a high impurity concentration and a relatively low acceleration energy of, for example, 3 to 5 keV.

FIG. 5A is a graph showing an impurity concentration distribution when B ions are implanted into single crystal and poly-silicon at an acceleration energy of 5 keV and a dose of $1\times10^{15}$ cm$^{-2}$. In FIG. 5A, the abscissa represents a depth from a surface in the unit of nm, and the ordinate represents a concentration of implanted B ions in the unit of cm$^{-3}$ in a logarithmic scale.

A curve s1 indicates an impurity concentration distribution when B ions are implanted into single crystal silicon along a substrate plane normal direction. A peak appears at some depth from the surface and thereafter the impurity concentration lowers. The lowering speed of the curve s1 decreases at some depth and then increases again, showing a shape like a shoulder.

A curve s2 indicates an impurity concentration distribution when an ion implantation angle is tilted from the substrate plane normal direction by 7 degrees. The shoulder of the curve s1 disappears and the impurity concentration lowers faster. At the low impurity concentration level, the curves s1 and s2 again become coincident.

A curve s3 indicates a concentration distribution profile when B ions are implanted into poly-silicon. A sample substrate was formed by forming a silicon oxide layer on a silicon substrate and by depositing a sufficiently thick (400 nm) poly-silicon layer on the silicon oxide layer. B ions were implanted along the substrate plane normal direction at an acceleration energy of 5 keV and a dose of $1\times10^{15}$ cm$^{-3}$.

A concentration distribution to some depth is similar to that when ions are implanted into single crystal along a direction tilted by 7 degrees from the plane normal direction. At a deeper region, a behavior different from that of single crystal appears, presenting a considerable tailing of the B concentration in poly-silicon. Namely, B ions are distributed to a depth deeper than an expected depth. This B concentration profile in poly-silicon was not changed when the ion implantation angle was tilted by 7 degrees from the plane normal direction.

This result indicates that when impurity ions are implanted at the same time into single crystal silicon and poly-silicon, the impurities are distributed deeper in poly-silicon.

In the case of MOS transistor, it is desired that ion implantation is limited to some depth in the gate electrode made of poly-silicon, and it is desired that ion implantation into source/drain regions arrives to the depth equal to that in the gate electrode or deeper. However, the ion implantations into single crystal and poly-silicon have tendencies contradictory to the desired profiles.

In order to suppress impurities from penetration through a gate insulating film, it is desired to prevent abnormal tailing when B ions are implanted into poly-silicon. Although it is known that the ion implantation depth can be limited if single crystal silicon is amorphousized, this effect has not been known to date relative to poly-silicon amorphousization.

Figure 5B:
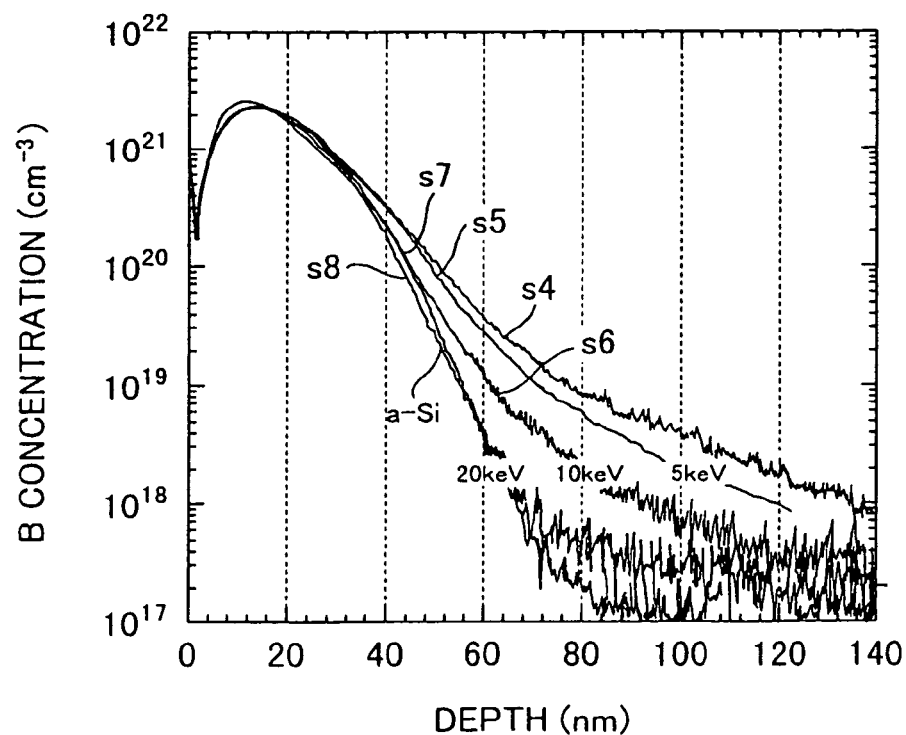

FIG. 5B is a graph showing the amorphous effect for poly-silicon. In FIG. 5B, the abscissa represents a depth from a poly-silicon surface in the unit of nm and the ordinate represents a B concentration in the unit of cm$^{-3}$ in a logarithmic scale. A silicon oxide layer was formed on a silicon substrate, a thick poly-silicon layer was formed on the silicon oxide layer, and Ge ions were implanted, and thereafter B ions were implanted at a concentration higher than that shown in FIG. 5A.

A curve s4 indicates the characteristics when Ge ions are not implanted. As B ions are implanted at a high concentration, the B concentration distribution presents intensive abnormal tailing.

A curve s5 indicates the B concentration distribution when Ge ions are implanted at an acceleration energy of 5 keV and thereafter B ions are implanted. As compared with the characteristics s4 when Ge ions are not implanted, it can be observed that the abnormal tailing is suppressed a little.

Curves s6 and s7 indicate the B concentration distributions when Ge ions are implanted at an acceleration energies of 10 keV and 20 keV respectively and thereafter B ions are implanted. The abnormal tailing of B atoms is reduced considerably. The abnormal tailing suppression effect becomes large as the acceleration energy is increased.

A curve s8 indicates the B concentration distribution when B ions are implanted into amorphous silicon. The curves s7 and s8 are generally coincident. Namely, it is supposed that as Ge ions are implanted at the acceleration energy of 20 keV, the upper region of poly-silicon is almost amorphousized. The abnormal tailing of B ions can be suppressed greatly if Ge ions are implanted at the acceleration energy of 10 to 20 keV. Although the acceleration energy may be set higher than 20 keV, the abnormal tailing suppression effect is not expected to be improved furthermore.

It is known that silicon crystal can be amorphousized by implanting Si, As or the like in place of Ge. Poly-silicon can be amorphousized by implanting ionic atoms having the mass and size capable of making silicon crystal amorphous. The abnormal tailing of subsequent B ion implantation is expected to be suppressed.

If single silicon crystal or poly-silicon is preliminarily amorphousized before B ion implantation, the implantation depth suppression is effected also in the source/drain regions so that the source/drain region junctions become shallow.

It is desired to make the junction planes of the source/drain regions deep and to prevent impurity ions implanted into the gate electrode from penetration through the gate insulating film.

The abnormal tailing of the B concentration shown in FIG. 5B appears when ion implantation is performed at a relatively low acceleration energy of about 3 to 5 keV and at a high dose. As the acceleration energy is lowered greatly, the degree of the abnormal tailing changes.

In the following, with reference to FIGS. 1A to 1L, description will be made on main processes of a semiconductor device manufacture method according to an embodiment of the present invention.

Figure 1A:
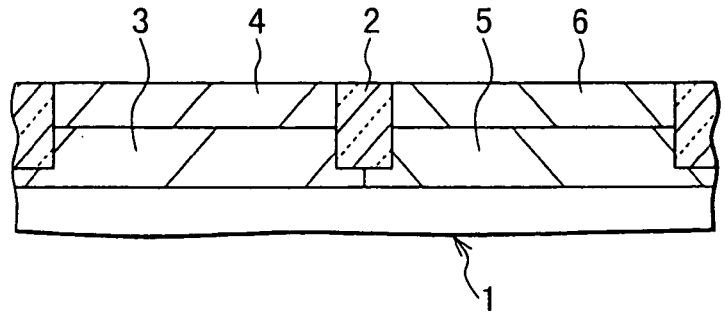
FIGS. 1A to 1L are cross sectional views of a semiconductor substrate schematically showing main processes of a semiconductor device manufacture method according to an embodiment of the present invention.

As shown in FIG. 1A, an element isolation region 2 is formed by STI on the surface of a silicon substrate 1. Any one of well-known methods may be used for the element isolation formation process by STI.

Different ion implantations are performed for a p-channel transistor region and an n-channel transistor region by opening respective active regions defined by the element isolation region 2 with resist masks. For the p-channel transistor region, for example, P ions are implanted at an acceleration energy of 300 to 500 keV and a dose of $2\times10^{13}$ cm$^{-2}$ to $4\times10^{13}$ cm$^{-2}$ to form an n-type well 3.

For the same p-channel transistor region, As ions are implanted at an acceleration energy of 60 keV to 150 keV or Sb ions are implanted at an acceleration energy of 100 keV to 200 keV, at a dose of $1\times10^{12}$ cm$^{-2}$ to $2\times10^{13}$ cm$^{-2}$, to form a threshold voltage adjusting region 4.

For the n-channel transistor region, for example, B ions are implanted at an acceleration energy of 100 to 200 keV and a dose of $2\times10^{13}$ cm$^{-2}$ to $4\times10^{13}$ cm$^{-2}$ to form a p-type well 5. Further, B ions are implanted at an acceleration energy of 10 keV to 30 keV or In ions are implanted at an acceleration energy of 60 keV to 200 keV, at a dose of $1\times10^{12}$ cm$^{-2}$ to $3\times10^{13}$ cm$^{-2}$, to form a threshold voltage adjusting region 6.

In the wells 3 and 5, an impurity concentration peak is formed at a depth deeper than the threshold voltage adjusting regions 4 and 6. An impurity concentration peak is formed in a shallow position of each of the threshold voltage adjusting regions 4 and 6. The depths of these impurity concentration peaks are called the depths of these regions.

Figure 1B:
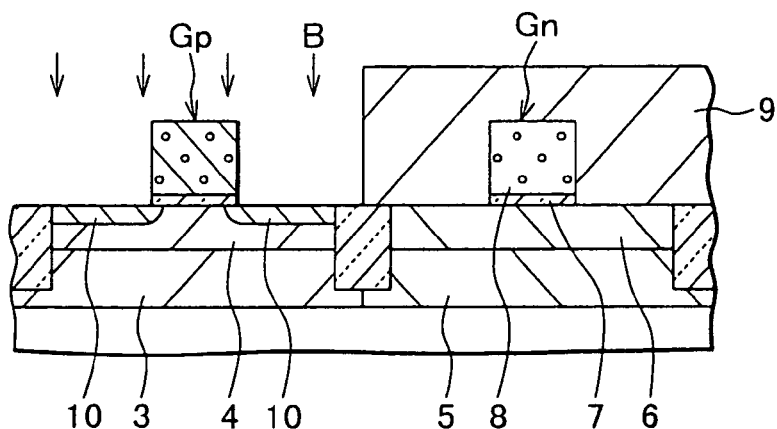

Referring to FIG. 1B, a gate oxide film 7 having a thickness of 1.5 nm to 10 nm is formed on the exposed well surfaces of the silicon substrate, by thermal oxidation. On the gate oxide film 7, a poly-silicon layer 8 having a thickness of 60 nm to 130 nm is deposited by CVD. A resist mask is formed on the poly-silicon layer 8, and the poly-silicon layer 8 and gate insulating film 7 are patterned to form gate electrodes Gp and Gn having a gate length of, e.g., 65 nm. The gate length becomes shorter as semiconductor devices are made finer. For example, a gate electrode having a gate length of 20 nm may be formed.

A resist mask 9 is formed covering the n-channel transistor region, and B ions are implanted into the p-channel transistor region at an acceleration energy of 0.3 keV to 0.5 keV and a dose of $0.5\times10^{15}$ cm$^{-2}$ to $2\times10^{15}$ cm$^{-2}$, to form a p-type extension region 10 of the p-channel transistor. The resist mask is thereafter removed.

B ions are also implanted at the same time into the poly-silicon layer 8 of the gate electrode Gp. Since the acceleration energy is as small as 0.3 keV to 0.5 keV, B ions penetration through the gate insulating layer are almost negligible.

For example, a substantial threshold voltage shift did not occur, up to a dose of $2\times10^{15}$ cm$^{-2}$ when B ions were implanted into a poly-silicon layer having a thickness of 75 nm at an acceleration energy of 0.5 keV, and up to a dose of $2.5\times10^{15}$ cm$^{-2}$ at an acceleration energy of 0.3 keV. It can be judged that if there is no substantial threshold voltage shift, B ions penetrating through the gate insulating layer do not exist substantially.

Figure 1C:
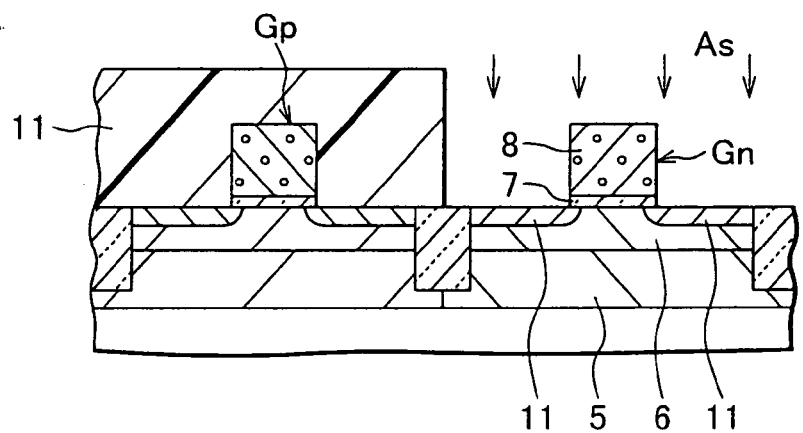

As shown in FIG. 1C, a resist mask 11 is formed covering the p-channel transistor region, and As ions are implanted into the n-channel transistor region at an acceleration energy of 0.5 keV to 3 keV and a dose of $0.5\times10^{15}$ cm$^{-2}$ to $2\times10^{15}$ cm$^{-2}$. Since As ions are implanted shallow, these ion implantation conditions can form a shallow extension region 11 and prevent penetration through the gate insulating film 7. The resist mask 11 is thereafter removed.

Figure 1D:
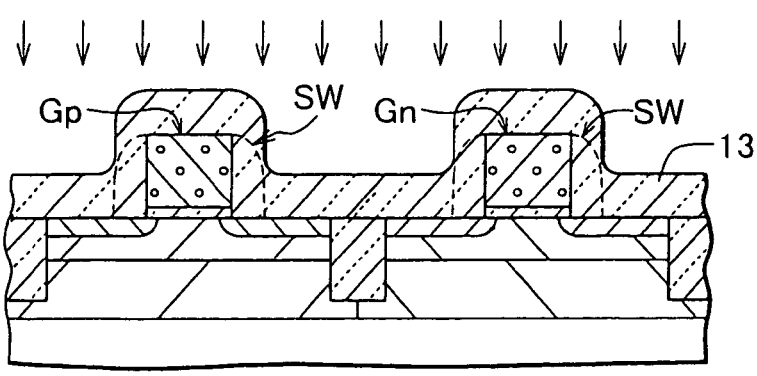

As shown in FIG. 1D, a tetraethoxy silicate (TEOS) oxide film 13 having a thickness of 60 nm to 150 nm is deposited by CVD, covering the gate electrodes Gp and Gn. The silicon oxide film 13 is etched back to leave side wall spacers SW only on the gate electrode side walls.

Figure 1E:
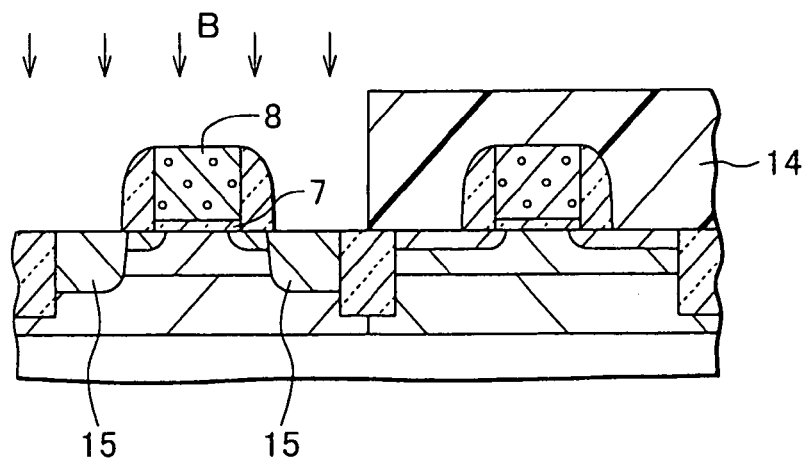

As shown in FIG. 1E, a resist mask 14 is formed covering the n-channel transistor region. B ions are implanted into the p-channel transistor region at an acceleration energy of 6 keV to 10 keV and a dose of $1\times10^{12}$ cm$^{-2}$ to $1\times10^{14}$ cm$^{-2}$, more preferably a dose of $3\times10^{12}$ cm$^{-2}$ to $4\times10^{13}$ cm$^{-2}$, to form source/drain regions 15. The resist mask 14 is thereafter removed.

Under these ion implantation conditions of a middle acceleration energy and a relatively low dose, abnormal tailing in the poly-silicon layer will not occur. There is, however, a possibility that implanted B ions pass through the polysilicon layer 8 and penetrate through the gate insulating film 7. Therefore, the ion implantation conditions are set so that the threshold voltage of the p-channel transistor does not shift substantially.

Figure 1F:
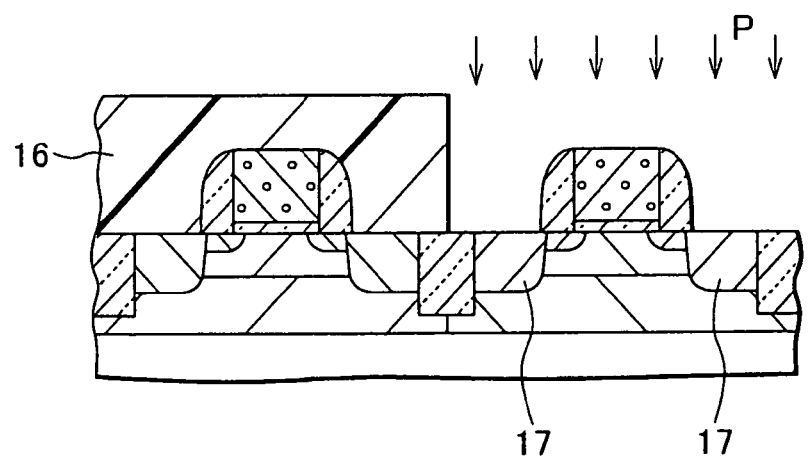

As shown in FIG. 1F, a resist mask 16 is formed covering the p-channel transistor region. P ions are implanted into the n-channel transistor region at an acceleration energy of 10 keV to 20 keV and a dose of $5\times10^{12}$ cm$^{-2}$ to $1\times10^{14}$ cm$^{-2}$, to form deep source/drain regions 17. Also in this case, the ion implantation conditions are set so that the threshold voltage does not shift substantially. The resist mask 16 is thereafter removed.

With the ion implantation processes shown in FIGS. 1E and 1F, the sufficiently deep source/drain regions 15 and 17 can be formed so that the capacitance of the source/drain regions can be made small. However, in this state, the impurity concentration in the source/drain regions is low and the resistance is not made sufficiently low.

Figure 1G:
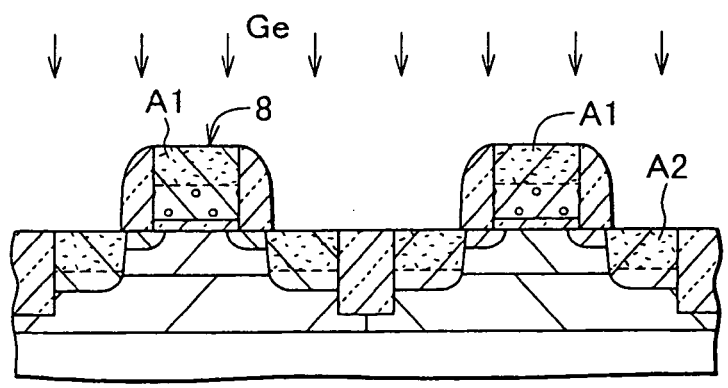

As shown in FIG. 1G, into both the p- and n-channel transistor regions, Ge ions are implanted at an acceleration energy of 10 keV to 20 keV and a dose of $5\times10^{14}$ cm$^{-2}$ to $4\times10^{15}$ cm$^{-2}$, to form amorphous regions A1 and A2 in the upper regions of the poly-silicon layers 8 of the gate electrodes and the source/drain regions 15 and 17.

Ge ion implantation at the acceleration energy of 10 keV to 20 keV as shown in FIG. 5B forms effective amorphous regions so that an abnormal concentration distribution such as abnormal tailing to be caused by subsequent ion implantations can be reduced considerably.

Figure 1H:
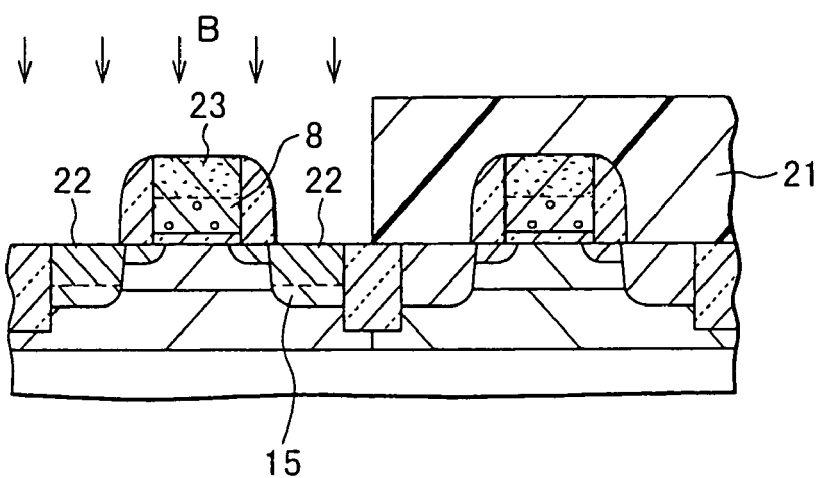

As shown in FIG. 1H, a resist mask 21 is formed covering the n-channel transistor region. B ions are implanted into the p-channel transistor region at an acceleration energy of 2 keV to 5 keV and a dose of $1\times10^{15}$ cm$^{-2}$ to $8\times10^{15}$ cm$^{-2}$, to form high concentration regions 22 in the source drain regions 15 and a high concentration region 23 in the poly-silicon layer 8 of the gate electrode. The resist mask 21 is thereafter removed.

The upper regions of the source/drain regions 15 and poly-silicon layer 8 are amorphous so that the depth of B ion implantation is limited. By doping B ions at a high concentration, the source/drain regions can have a low resistance.

Figure 1I:
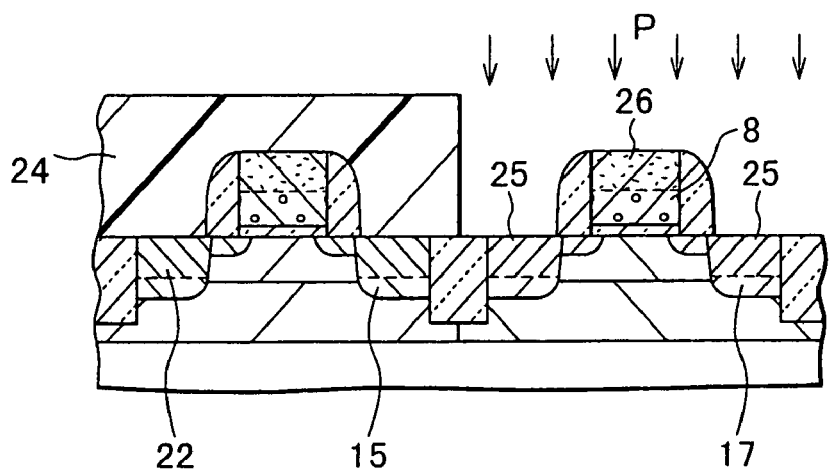

As shown in FIG. 1I, a resist mask 24 is formed covering the p-channel transistor region. P ions are implanted into the n-channel transistor region at an acceleration energy of 6 keV to 10 keV and a dose of $1\times10^{15}$ cm$^{-2}$ to $2\times10^{16}$ cm$^{-2}$, to form high concentration regions 25 in the source drain regions 17 and a high concentration region 26 in the poly-silicon layer 8 of the gate electrode. The resist mask 24 is thereafter removed. Since P ions are doped at a high concentration, the source/drain regions have a low resistance.

Figure 1J:
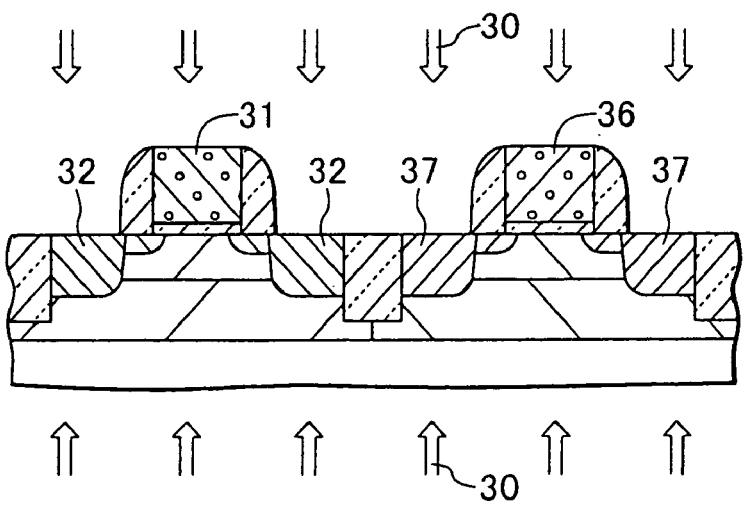

As shown in FIG. 1J, light 30 of lamps are applied to top and bottom surfaces of the semiconductor wafer to perform spike annealing at 1000° C. to 1100° C. and a retention time at the highest temperature of 0 second. This spike annealing activates implanted impurity ions without substantial diffusion.

In this manner, the gate electrode 31 sufficiently doped with impurities and the source/drain regions 32 sufficiently and deeply doped with impurities are formed in the p-channel transistor region, and the gate electrode 36 sufficiently doped with impurities and the source/drain regions 37 sufficiently and deeply doped with impurities are formed in the n-channel transistor region.

Figure 1K:
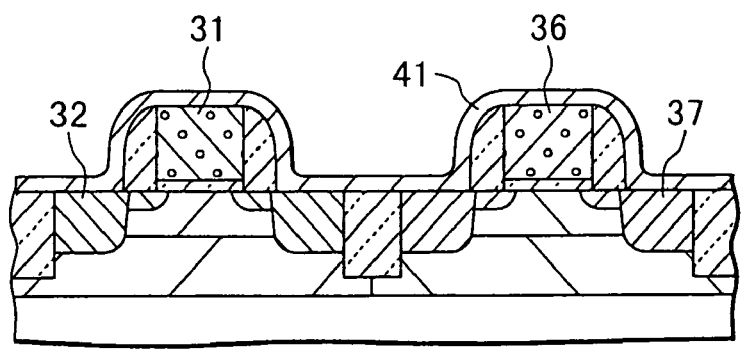

As shown in FIG. 1K, a metal layer 41 of Co or Ni is formed on the whole substrate surface by sputtering. If necessary, an oxidation preventing layer of TiN or the like may be stacked. A silicidation reaction occurs in the region where the metal layer 41 and silicon layer contact. For example, a primary annealing process performs a primary silicidation reaction, an unnecessary metal layer 41 is removed, and thereafter, a secondary silicidation reaction is performed to form a low resistance silicide layer.

Figure 1L:
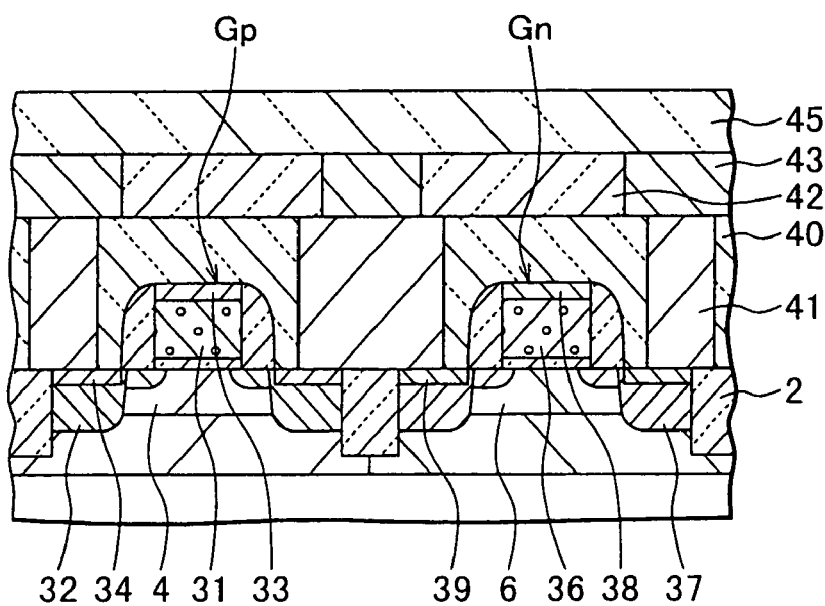

As shown in FIG. 1L, a silicide layer 33 is formed on the gate electrode 31 of the p-channel transistor and silicide layers 34 are formed on the surfaces of the source/drain regions 32. Similarly, a silicide layer 38 is formed on the gate electrode 36 of the p-channel transistor and silicide layers 39 are formed on the surfaces of the source/drain regions 37. Since the source/drain regions 32 and 37 have sufficiently deep depths, it is possible to suppress an increase in leak current even if the silicide layers are formed. Further, since the source/drain regions 32 and 37 are formed sufficiently deeper than the threshold volatge adjusting regions 4 and 7, the junction capacitance can be lowered.

An insulating layer 40 of silicon oxide or the like is deposited covering the gate electrodes Gp and Gn, contact holes are formed through the insulating layer, and conductive plugs 41 are buried in the contact holes. In the state shown in FIG. 1L, the conductive plugs 41 form border-less contacts. Since the source/drain regions 32 and 37 are formed sufficiently deep, even if the concave portions are formed on the upper edges of the STI region 2, an increase in leak current can be suppressed.

Another insulating layer 42 is formed on the insulating layer 40 and wirings 43 are formed by a damascene process. Another insulating layer 45 is stacked to form necessary wirings. The wirings can be formed by well-known techniques. The number of necessary wiring layers are formed to complete a semiconductor device.

Figure 2A:
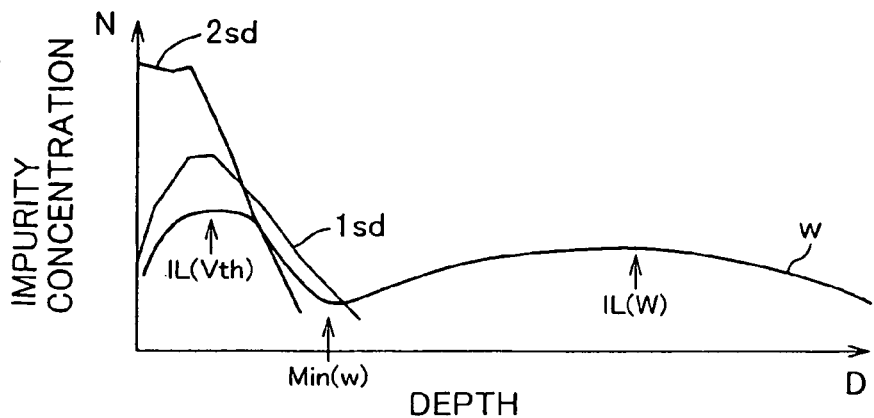
FIGS. 2A to 2C are graphs explaining the characteristics of a semiconductor device manufactured by the processes shown in FIGS. 1A to 1L.
Figure 2B:
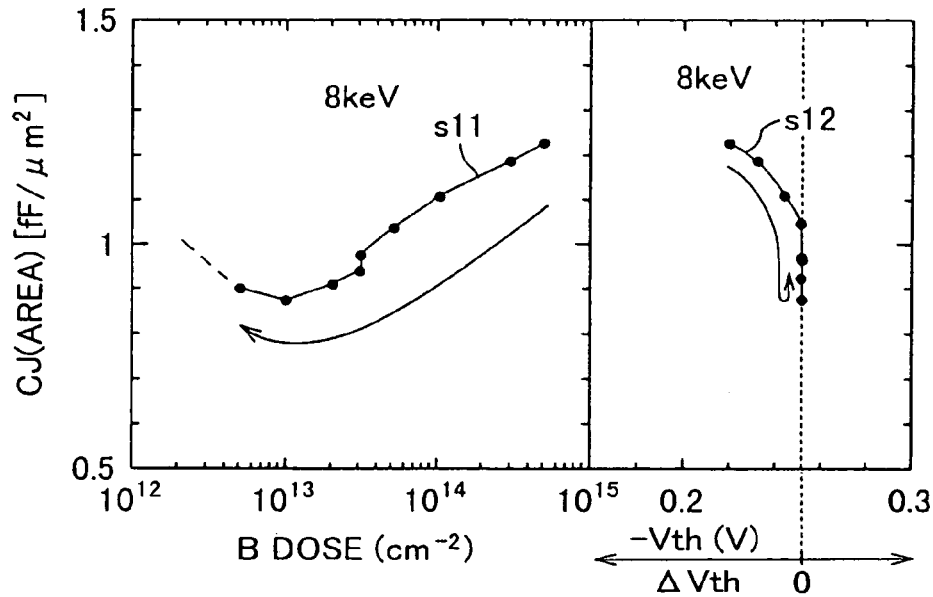
Figure 2C:
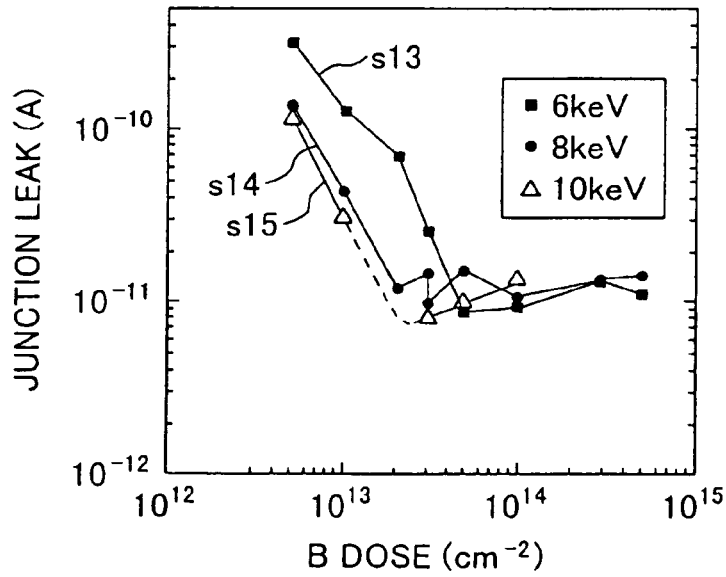

FIGS. 2A to 2C are graphs explaining a preferable selection of the ion implantation conditions in the above-described embodiment. The description will be made by taking as an example a p-channel transistor which has an issue of B ions penetration through a gate insulating film.

FIG. 2A is a graph showing an impurity concentration distribution along a substrate depth direction. The abscissa represents a depth from the surface in a linear scale, and the ordinate represents impurity concentrations in a logarithmic scale. A curve w indicates an n-type impurity concentration distribution in an n-type well.

An n-type impurity concentration distribution having a peak IL (W) at a substrate deep position is formed by the well forming ion implantation (if necessary, also a parasitic transistor suppression ion implantation). This impurity concentration distribution gradually weakens as the depth becomes shallower. A higher peak concentration IL (Vth) is formed near at a surface layer by the threshold voltage adjusting ion implantation. At the middle of the two ion implantation peaks, a minimum point Min (w) of the n-type impurity concentration is formed.

A curve 1sd indicates the p-type impurity concentration distribution by the deep ion implantation shown in FIG. 1E. A curve 2sd indicates the p-type impurity concentration distribution formed by the high concentration ion implantation after forming the amorphous regions. The p-type impurity concentration distribution of the source/drain regions is an addition of the impurity concentration distributions 1sd and 2sd. The junction with the n-type well w is a cross point between the deep impurity concentration distribution 1sd and the well concentration distribution w. If this cross point coincides with the minimum point Min (w) of the impurity concentration distribution, the junction capacitance becomes minimum. If the cross point shifts toward the shallow region, the well impurity concentration rises abruptly so that the junction capacitance increases abruptly. Even if the cross point shifts from the minimum point Min (w) toward the deep region, the junction capacitance increases because the n-type impurity concentration gradually increases by the well forming ion implantation.

The left part of FIG. 2B is a graph showing a change in a junction capacitance relative to a B dose when the first ion implantation shown in FIG. 1E for the source/drain regions is performed at an acceleration energy of 8 keV. A curve s11 shows a change in a capacitance Cj relative to the dose. The capacitance reduces as the dose is reduced gradually from a high dose.

This means that the pn junction gradually moves from a well deep position toward the minimum point Min (w) of the impurity concentration distribution. As shown, the capacitance Cj takes a minimum value near at the dose of $1\times10^{13}$ cm$^{-2}$.

As the dose is reduced further, the capacitance increases. This means that the pn junction traverses the minimum point Min (w) and comes nearer to the surface. In order to suppress the capacitance small, it is desired to set the dose to $1\times10^{12}$ cm$^{-2}$ to $1\times10^{14}$ cm$^{-2}$, or more preferable to $3\times10^{12}$ cm$^{-2}$ to $4\times10^{13}$ cm$^{-2}$.

The right part of FIG. 2B is a graph showing a change in the threshold voltage Vth of the same sample. A curve s12 corresponds to the curve s11 and indicates the relation between the capacitance Cj and a threshold voltage change ΔVth. A threshold volatge of a comparative sample R is also shown as ΔVth=0, which sample was not subjected to the deep ion implantation into the source/drain regions. If the threshold voltage does not change, it can be considered that there is no impurities penetration through the gate insulating film.

As the dose is reduced gradually from a high dose, the threshold volatge change ΔVth gradually becomes near 0 and eventually takes the same value as that of the comparative sample R. As the dose is reduced, the capacitance reduces having the same threshold volatege, takes the minimum value and thereafter increases.

It can be judged that impurity penetration, through the gate insulating film, does not occur if the region where the threshold voltage does not change substantially is selected.

FIG. 2C is a graph showing a change in junction leak current relative to the dose of deep B ion implantation. A curve s13 indicates the junction leak current at an acceleration energy of 6 keV, a curve s14 indicates the junction leak current at an acceleration energy of 8 keV, and a curve s15 indicates the junction leak current at an acceleration energy of 10 keV.

If a dose is small, leak current is large, which indicates that the junction is formed at a shallow position. As the dose is increased, leak current reduces, which indicates that the junction moves gradually to a deeper position. As the dose is increased over some level, leak current takes generally a constant value. This means that the influence of leak current between the junction and the silicide region or conductive plug is released and the leak current of the junction itself becomes dominant.

Figure 3A:
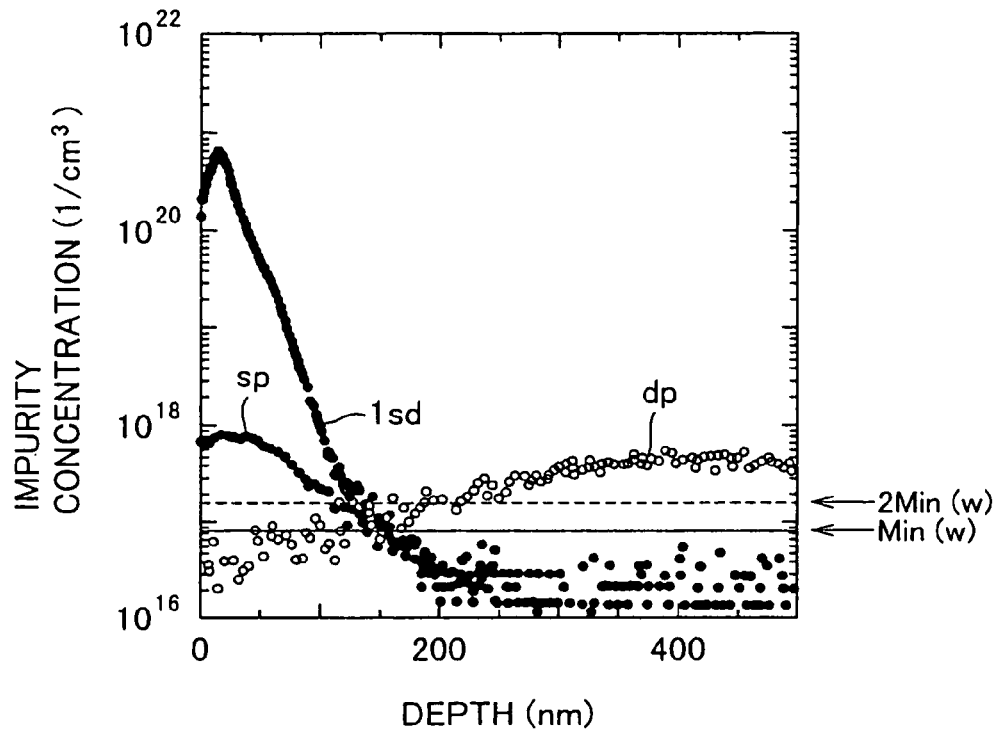
FIGS. 3A and 3B are graphs explaining the criterion for selecting parameters of ion implantation.

FIG. 3A is a graph showing the experimental results of a concentration distribution of implanted impurity ions by secondary ion mass spectroscopy (SIMS). The abscissa represents a depth from a substrate surface in the unit of nm, and the ordinate represents impurity concentrations in the unit of $cm^{-3}$ in a logarithmic scale. A curve dp indicates an impurity concentration distribution by the well forming deep ion implantation, and a curve sp indicates an impurity concentration distribution by the threshold voltage adjusting shallow ion implantation. The n-type impurity concentration distribution in the well is an addition of these two distributions dp and sp.

Min (w) represents a minimum point of the n-type impurity concentration distribution. A curve 1sd indicates an impurity concentration distribution formed by the deep ion implantation into the source/drain regions. A cross point between the impurity concentration distribution and the n-type impurity concentration distribution in the well indicates the position of the pn junction. The junction capacitance can be minimized by setting the pn junction position near to the minimum point Min (w) of the n-type impurity concentration distribution. It can be considered that the junction capacitance can be minimized if the pn junction position is in the range from the minimum point Min (w) of the impurity concentration distribution to 2×Min (w).

The threshold voltages have a distribution even among samples formed by the same process. Whether the threshold voltage changes or not can be judged from the relation between the median value and standard deviation of the threshold voltages of comparative samples.

Figure 3B:
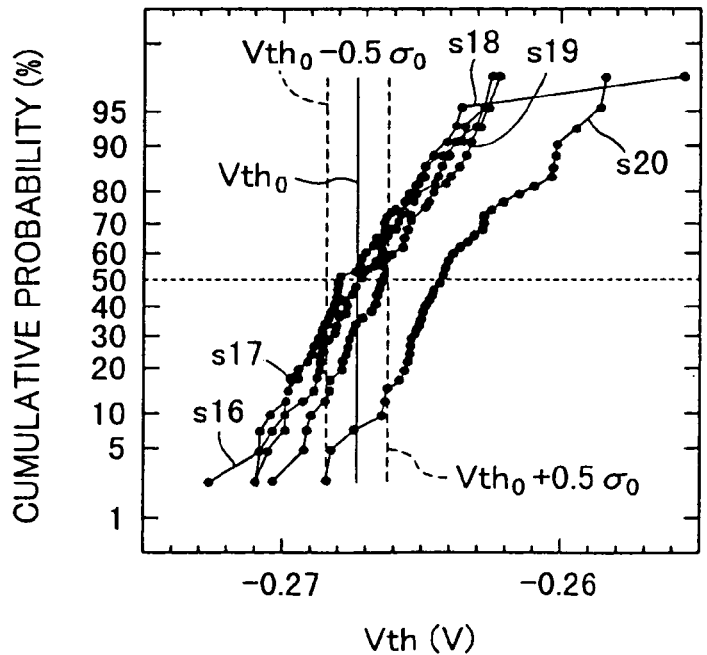
Figure 4A:
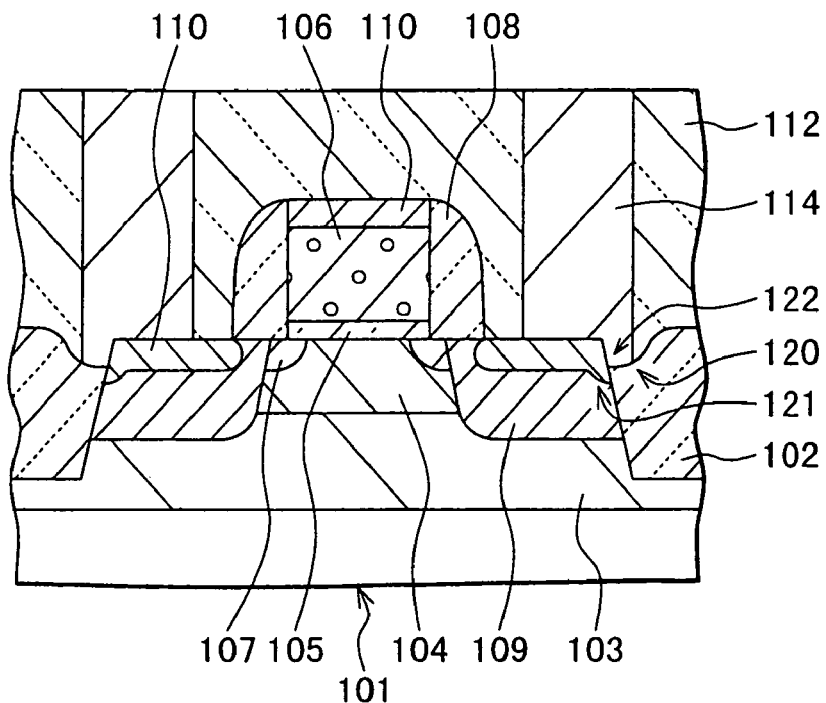
FIGS. 4A and 4B are schematic cross sectional views explaining the structure of a short channel MOS transistor according to prior art.
Figure 4B:
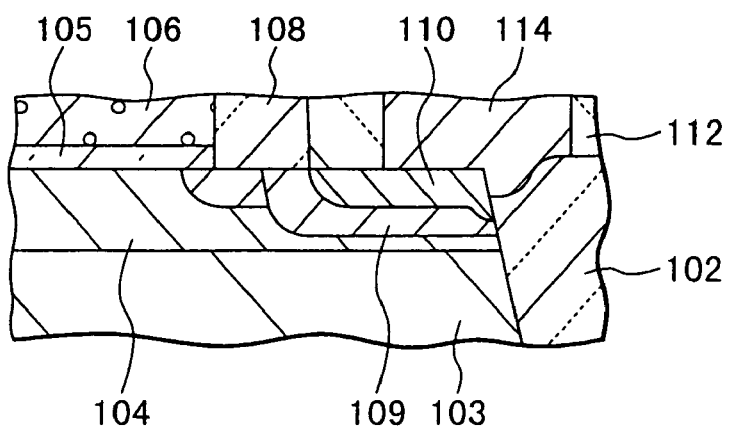

FIG. 3B is a graph showing a cumulative probability distribution of threshold voltage Vth. Curves s16 and s17 indicate the samples without the deep ion implantation into the source/drain regions. The median value of this distribution is Vth0. The range of 0.5 $\sigma_0$, where $\sigma_0$ is standard deviation, on both sides of the median value, Vth0−0.5 $\sigma_0 \leq$ Vth $\leq$ Vth0+0.5 $\sigma_0$, can be considered as a criterion whether the threshold voltage is changed or not.

It is expected that a threshold voltage change can be judged from the threshold volatge of an independent semiconductor device and from the median value of threshold voltages of a number of semiconductor devices of the same lot. Curves s18 and s19 indicate cumulative probability distributions formed by B ion implantations at a low dose and a middle dose, respectively. The median value of threshold voltages of these distributions is in the range of Vth0−0.5 $\sigma_0 \leq$ Vth $\leq$ Vth0+0.5 $\sigma_0$. A curve s20 indicates the cumulative probability distribution formed at a deep ion implantation and a high dose. The threshold voltages are shifted greatly and the median value of threshold voltages is out of the range of Vth0−0.5 $\sigma_0 \leq$ Vth $\leq$ Vth0+0.5 $\sigma_0$.

In n-channel transistors, n-type impurity P or As is used for forming the source/drain regions, and causes less penetration through the gate insulating film than B. However, also in this case, if the gate height is lowered and the gate insulating film is made thin, penetration through the gate insulating film may occur. In this case, similar to the p-channel transistor, it is desired that the junction depth of the source/drain regions of the n-channel transistor is kept sufficient while suppressing impurities from penetration thorough the gate insulating film.

The present invention has been described in connection with the preferred embodiments. The invention is not limited only to the above embodiments. It will be apparent to those skilled in the art that other various modifications, improvements, combinations, and the like can be made.

APPLICABILITY TO INDUSTRY

Manufacture of semiconductor devices having micro fine transistors with thin gate electrodes.

What are claimed are:

1. A semiconductor device manufacture method comprising the steps of:
  (a) preparing a semiconductor substrate comprising a well of a first conductivity type having a first depth and a threshold voltage adjusting region formed in said well and having a second depth shallower than the first depth;
  (b) forming a gate electrode above said semiconductor substrate, with a gate insulating film being interposed therebetween;
  (c) forming shallow low resistance regions in said semiconductor substrate by implanting impurity ions of a second conductivity type at a first dose and a first acceleration energy, to form extension regions in said semiconductor substrate on both sides of said gate electrode;
  (d) forming side wall spacers on side walls of said gate electrode;
  (e) forming source/drain regions by implanting impurity ions of the second conductivity type at a second acceleration energy higher than said first acceleration energy and a second dose, said source/drain regions forming junctions at a third depth deeper than the second depth;
  (f) implanting ions into said semiconductor substrate to amorphousize an upper layer of said gate electrode and upper layers of said source/drain regions;
  (g) implanting impurity ions of the second conductivity type at a third acceleration energy and a third dose larger than said second dose to form high concentration regions in said source/drain regions; and
  (h) activating implanted impurity ions.

2. The semiconductor device manufacture method according to claim 1, wherein said gate electrode includes a polycrystalline semiconductor layer.

3. The semiconductor device manufacture method according to claim 1, wherein said third acceleration energy is lower than said second acceleration energy.

4. The semiconductor device manufacture method according to claim 1, wherein said step (a) forms a concentration distribution of first conductivity type impurities having two peaks and a minimum value between the two peaks along a depth direction of said semiconductor substrate, and said step (e) forms the junctions at a depth in the range from a depth of said minimum value to a depth of concentration twice the minimum value.

5. The semiconductor device manufacture method according to claim 1, wherein said step (e) is executed by not substantially changing a threshold voltage in a channel region under said gate electrode.

6. The semiconductor device manufacture method according to claim 5, wherein not substantially changing the threshold volatge means that if a median value is Vth0 and a standard deviation is $\sigma_0$ when said step (e) is not executed, the median value of threshold voltages when said step (e) is executed is in a range from Vth0−0.5 $\sigma_0$ to Vth0+0.5 $\sigma_0$.

7. The semiconductor device manufacture method according to claim 1, wherein atoms used in said step (f) are Ge.

8. The semiconductor device manufacture method according to claim 1, wherein the impurity ions of the second conductivity type are B, and said first acceleration energy is in a range from 0.3 keV to 0.5 keV.

9. The semiconductor device manufacture method according to claim 1, wherein the impurity ions of the second conductivity type are B, said second acceleration energy is in a range from 6 keV to 10 keV, and said second dose is in a range from $1\times10^{12}$ cm$^{-2}$ to $1\times10^{14}$ cm$^{-2}$.

10. The semiconductor device manufacture method according to claim 9, wherein said second dose is in a range from $3\times10^{12}$ cm$^{-2}$ to $4\times10^{13}$ cm$^{-2}$.

11. The semiconductor device manufacture method according to claim 1, wherein the impurity ions of the second conductivity type are B, said third acceleration energy is in a range from 2 keV to 5 keV, and said third dose is in a range from $1\times10^{15}$ cm$^{-2}$ to $8\times10^{15}$ cm$^{-2}$.

12. The semiconductor device manufacture method according to claim 1, wherein said step (h) is executed by spike annealing of lamp heating.

13. The semiconductor device manufacture method according to claim 1, wherein said step (a) prepares said semiconductor substrate further comprising another well of the second conductivity type having a fourth depth and a threshold voltage adjusting region formed in said another well and having a fifth depth shallower than the fourth depth, said step (b) forms another gate electrode above said semiconductor substrate, with a gate insulating film being interposed therebetween; further comprising the steps of:

(c1) forming shallow low resistance regions in said another well by implanting impurity ions of the first conductivity type at a fourth dose and a fourth acceleration energy not allowing to penetrate through the gate insulating film under said other gate electrode, to form extension regions in said another well on both sides of said other gate electrode;

(e1) forming other source/drain regions in said another well by implanting impurity ions of the first conductivity type at a fifth acceleration energy higher than said fourth acceleration energy, said source/drain regions forming junctions at a sixth depth deeper than the fifth depth; and (g1) implanting impurity ions of the first conductivity type at a sixth acceleration energy and a sixth dose larger than said fifth dose to form high concentration regions in said other source/drain regions, wherein said step (d) forms side wall spacers also on side walls of said another gate electrode, said step (f) implants ions to make amorphous an upper layer of said another gate electrode and upper layers of said other source/drain regions, and said step (h) activates implanted impurity ions in said another well.

14. The semiconductor device manufacture method according to claim 13, wherein said step (a) forms a concentration distribution of impurities having two peaks and a minimum value between the two peaks along a depth direction of said semiconductor substrate, and said steps (e) and (e1) form the junctions at a depth in the range from a depth of said minimum value to a depth of a concentration twice the minimum value.

15. The semiconductor device manufacture method according to claim 13, wherein said steps (e) and (e1) are executed by not substantially changing threshold voltages in channel regions under said gate electrode and said another gate electrode.

16. The semiconductor device manufacture method according to claim 15, wherein not substantially changing the threshold voltage means that if a median value is Vth0 and a standard deviation is $\sigma_0$ when said steps (e) and (e1) are not executed, the median value of threshold voltages when said steps (e) and (e1) are executed is in a range from Vth0−0.5 $\sigma_0$ to Vth0+0.5 $\sigma_0$.

17. The semiconductor device manufacture method according to claim 13, wherein said step (h) is executed by spike annealing of lamp heating.

* * * * *